(12) United States Patent
Shiao et al.

(10) Patent No.: US 8,630,131 B1
(45) Date of Patent: Jan. 14, 2014

(54) DATA STROBE ENABLE CIRCUITRY

(75) Inventors: Wilma Shiao, San Jose, CA (US);
Warren Nordyke, Cupertino, CA (US);
Khai Nguyen, San Jose, CA (US);
Chiakang Sung, Milpitas, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 13/562,204

(22) Filed: Jul. 30, 2012

(51) Int. Cl.
*G11C 5/14* (2006.01)
*G11C 7/06* (2006.01)
*G11C 7/00* (2006.01)
*G11C 8/16* (2006.01)
*H03K 17/16* (2006.01)
*H03K 19/003* (2006.01)

(52) U.S. Cl.
USPC ............... 365/189.07; 365/193; 365/233.13; 326/30

(58) Field of Classification Search
USPC ........... 326/63, 30; 327/333; 365/189.09, 193
See application file for complete search history.

(56) References Cited

U.S. PATENT DOCUMENTS

| | | | |
|---|---|---|---|
| 6,215,710 B1 * | 4/2001 | Han et al. ....................... 365/193 |
| 6,317,369 B1 * | 11/2001 | Kubo et al. ..................... 365/193 |
| 6,512,704 B1 * | 1/2003 | Wu et al. .................. 365/189.07 |
| 6,950,370 B2 * | 9/2005 | Lee ............................ 365/233.13 |
| 7,020,031 B2 | 3/2006 | Shin et al. |
| 7,031,205 B2 | 4/2006 | Han et al. |
| 7,652,932 B2 * | 1/2010 | Millar et al. ............. 365/189.07 |
| 7,703,063 B2 * | 4/2010 | Hovis et al. ................... 716/122 |
| 7,710,799 B2 | 5/2010 | Na et al. |
| 7,840,830 B2 * | 11/2010 | Yoon ............................. 713/500 |
| 8,208,321 B2 * | 6/2012 | Huang et al. .................. 365/193 |
| 2005/0018494 A1 * | 1/2005 | Wu et al. ........................ 365/193 |
| 2006/0168470 A1 | 7/2006 | Han et al. |
| 2009/0052261 A1 * | 2/2009 | Koo et al. ................. 365/189.07 |
| 2009/0190410 A1 * | 7/2009 | Faue ........................ 365/189.05 |
| 2012/0170384 A1 | 7/2012 | Oh |
| 2012/0294099 A1 * | 11/2012 | Mueller ........................ 365/193 |

OTHER PUBLICATIONS

Manohararajah et al., U.S. Appl. No. 13/149,562, filed May 31, 2011.
Yan et al., U.S. Appl. No. 13/686,727, filed Nov. 27, 2012.

* cited by examiner

*Primary Examiner* — Shawki Ismail
*Assistant Examiner* — Dylan White
(74) *Attorney, Agent, or Firm* — Treyz Law Group; Jason Tsai

(57) ABSTRACT

An integrated circuit may include memory interface circuitry that is used to communicate with off-chip memory. The memory interface circuitry may include data strobe (DQS) enable circuitry that receives DQS signals from the off-chip memory and that outputs a gated version of the DQS signals. The DQS enable circuitry may include an input buffer, a comparator, a latch, a flip-flop, a counter, and a gating circuit. The input buffer may receive an incoming DQS signal. The comparator may be used to determine when the incoming DQS signal starts to toggle. The latch may be used to control when a gating signal is asserted. The flip-flop controls the counter, which limits the duration that the gating signal is asserted. The gating circuit receives the DQS signal from the buffer and the gating signal and passes the DQS signal through to its output only when the gating signal is asserted.

20 Claims, 8 Drawing Sheets

DATA STROBE ENABLE CIRCUITRY

BACKGROUND

Programmable integrated circuits are a type of integrated circuit that can be configured by a user to implement custom logic functions. In a typical scenario, a logic designer uses computer-aided design (CAD) tools to design a custom logic circuit. When the design process is complete, the CAD tools generate configuration data. The configuration data is loaded into a programmable integrated circuit to configure the device to perform desired logic functions.

In a typical system, a programmable integrated circuit, memory devices, and other electronic components are mounted on a printed circuit board. The programmable integrated circuit includes memory interface circuitry that is used to relay data back and forth between the programmable integrated circuit and the memory devices (i.e., the memory interface circuitry is used to read data from and write data into the memory devices). When performing such memory read and write operations, the timing of control and data signals is critical.

Because programmable integrated circuits can be configured in many different ways and are installed on many different types of boards, the lengths of circuit board traces coupling the programmable integrated circuit to the memory devices can vary from one system to another. As a result, it is generally not possible to know in advance exactly how data and clock paths between a programmable integrated circuit and a given memory device will perform. In some systems, the data and clock paths may have one set of timing characteristics, whereas in other systems the data and clock paths may have a different set of timing characteristics.

Mismatch (or skew) between the data and clock paths may result in degraded setup and hold times. In modern high speed memory interface circuitry that use double data rate (DDR) transfers (i.e., a data transmission scheme in which data toggles on both rising and falling edges of the clock), a small amount of skew and/or jitter will result in faulty data transfer during read and write operations.

SUMMARY

An integrated circuit may include memory interface circuitry that is used for receiving data and data strobe (DQS) signals from memory that is external to the integrated circuit. The off-chip memory may include multiple memory groups. The memory interface circuitry may include DQS enable circuitry that receives a data strobe signal from an associated memory group and that outputs a corresponding gated version of the data strobe signal.

The DQS enable circuitry may include an input buffer, a comparator, and a latching and gating circuit. The data strobe signal that is being conveyed from the memory to the memory interface circuitry during a memory read operation may be a differential data strobe signal that includes a first (positive) signal and a second (negative) signal. The buffer may receive the differential data strobe signal and output a single-ended data strobe signal. The comparator may receive the first signal of the differential data strobe signal and a reference signal having a fixed voltage level and may output a comparator output signal.

The latching and gating circuit may have a first input that receives the single-ended data strobe signal, a second input that receives that comparator output signal, a third input that receives a data strobe enable signal, and an output on which the gated version of the data strobe signal is generated. In particular, the latching and gating circuit may include a latch, a flip-flop, a counter, and a gate.

The latch may receive the comparator output signal and the data strobe enable signal and may output a reset signal. The flip-flop may have a clock input that receives an inverted version of the single-ended data strobe signal, a control input that receives the reset signal from the latch, an input, and an output on which a data strobe gating signal is provided. The counter may have a clock input that receives the inverted version of the single-ended data strobe signal, a control input that receives the data strobe gating signal, and an output on which a counter control signal is provided. The data strobe gating signal and the counter control signal may be combined and fed to the input of the flip-flop (e.g., the input of the flip-flop may receives an input signal generated based on combination of data strobe gating signal DQS_Gate and the counter control signal). The gate may have a first input that receives the single-ended data strobe signal, a second input that receives the data strobe gating signal, and an output on which the gated version of the data strobe signal is provided. The gate may be a logic AND gate (as an example).

The first and second signals of the differential data strobe signal may be asserted during a read post-amble time period. The first and second signals may have different voltage levels during a read pre-amble time period (e.g., the first signal may be asserted while the second is deasserted, and vice versa). The memory interface circuitry may receive invalid data during the read post-amble and read pre-amble windows. The DQS enable circuitry may be configured to detect assertion of the data strobe enable signal during the read post-amble window and during the read pre-amble window.

In response to detecting assertion of the data strobe enable signal during the read post-amble window, the DQS enable circuitry may wait for the comparator output signal to fall low before asserting the data strobe gating signal. The assertion of the data strobe gating signal should occur before arrival of valid data from the memory. In response to detecting assertion of the data strobe enable signal during the read pre-amble window, the DQS enable circuitry may immediately assert the data strobe gating signal. The data strobe gating signal may determine whether the data strobe signal is used by the memory interface circuitry for receiving the valid data (e.g., the gated version of the single-ended data strobe signal may be used to latch the valid data).

Further features of the present invention, its nature and various advantages will be more apparent from the accompanying drawings and the following detailed description.

DETAILED DESCRIPTION

Embodiments of the present invention relate to integrated circuits that contain memory interface circuitry. The memory interface circuitry may be used to interface with off-chip memory such as random-access memory (RAM). The integrated circuits may be digital signal processors, microprocessors, application specific integrated circuits, or other suitable integrated circuits. With one suitable arrangement, the integrated circuits that communicate with memory are programmable integrated circuits such as programmable logic device integrated circuits or other programmable integrated circuits that contain programmable circuitry. The programmable circuitry can be programmed using configuration data. Programmable integrated circuits are typically operated in a diverse set of system environments. As a result, these integrated circuits tend to benefit from adjustable timing capabilities of the memory interface circuitry.

Figure 1:
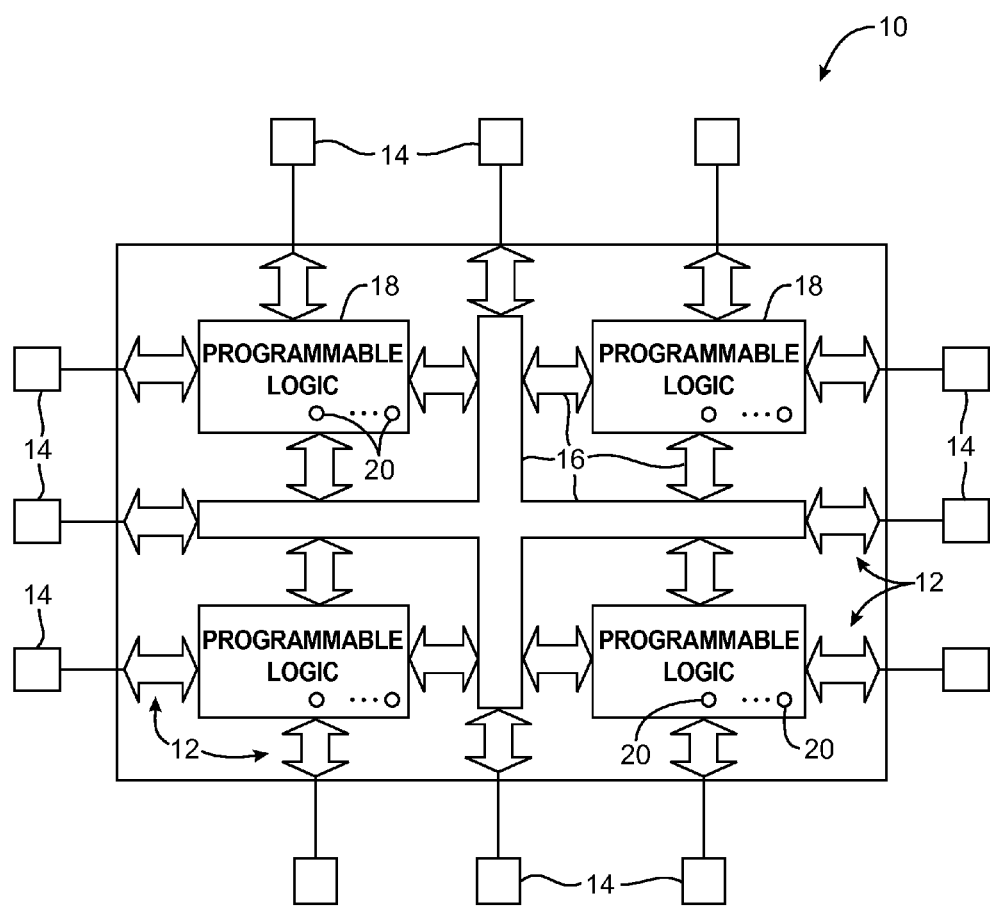
FIG. 1 is a diagram of an illustrative programmable integrated circuit in accordance with an embodiment of the present invention.

FIG. 1 shows a diagram of an illustrative programmable integrated circuit. As shown in FIG. 1, device 10 may have input-output (I/O) circuitry 12 for driving signals off of device 10 and for receiving signals from other devices via input-output pins 14. Interconnection resources 16 such as global and local vertical and horizontal conductive lines and buses may be used to route signals on device 10. Interconnection resources 16 include fixed interconnects (conductive lines) and programmable interconnects (i.e., programmable connections between respective fixed interconnects). Programmable logic 18 may include combinational and sequential logic circuitry. For example, programmable logic 18 may include look-up tables, registers, and multiplexers. The programmable logic 18 may be configured to perform a custom logic function. The programmable interconnects associated with interconnection resources may be considered to be a part of programmable logic 18.

Programmable logic 18 contains programmable elements 20. Programmable elements 20 may be based on any suitable programmable technology, such as fuses, antifuses, electrically-programmable read-only-memory technology, random-access memory cells, mask-programmed elements, etc. As an example, programmable elements 20 may be formed from memory cells. During programming, configuration data is loaded into the memory cells using pins 14 and input-output circuitry 12. The memory cells are typically random-access-memory (RAM) cells. Because the RAM cells are loaded with configuration data, they are sometimes referred to as configuration RAM cells (CRAM).

Programmable element 20 may be used to provide a static control output signal for controlling the state of an associated logic component in programmable logic 18. The output signals generated by elements 20 are typically applied to gates of metal-oxide-semiconductor (MOS) transistors (sometimes referred to as pass gate transistors).

The circuitry of device 10 may be organized using any suitable architecture. As an example, logic 18 of programmable device 10 may be organized in a series of rows and columns of larger programmable logic regions, each of which contains multiple smaller logic regions. The logic resources of device 10 may be interconnected by interconnection resources 16 such as associated vertical and horizontal conductors. These conductors may include global conductive lines that span substantially all of device 10, fractional lines such as half-lines or quarter lines that span part of device 10, staggered lines of a particular length (e.g., sufficient to interconnect several logic areas), smaller local lines, or any other suitable interconnection resource arrangement. If desired, the logic of device 10 may be arranged in more levels or layers in which multiple large regions are interconnected to form still larger portions of logic. Other device arrangements may use logic that is not arranged in rows and columns.

Figure 2:
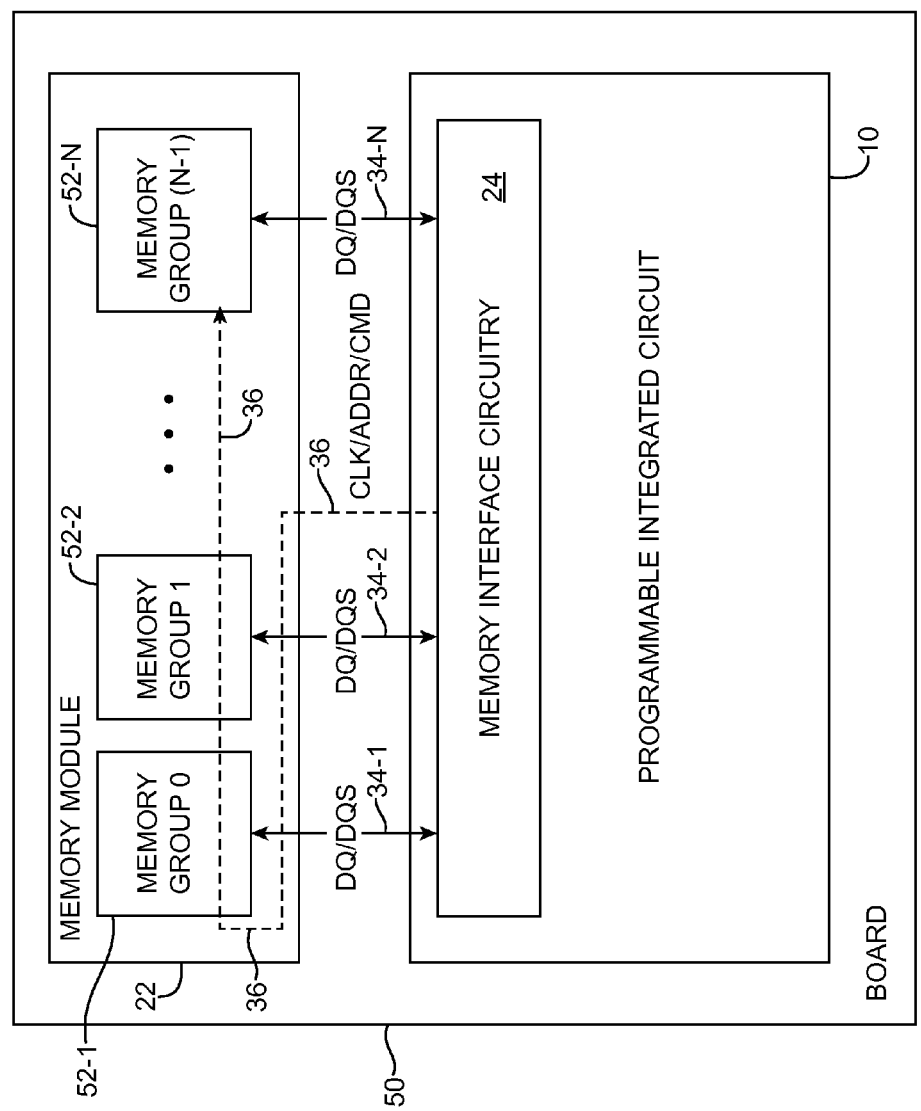
FIG. 2 is a diagram of illustrative memory interface circuitry operating in write leveling mode in accordance with an embodiment, of the present invention.

Device 10 may communicate with off-chip memory such as memory module 22. Memory module 22 may be a memory device sometimes referred to as a single in-line memory module (SIMM) or a dual in-line memory module (DIMM). Device 10 may be configured to communicate with at least two memory modules 22, at least four memory modules 22, etc. As shown in FIG. 2, device 10, memory module 22, and other circuit components (e.g., integrated circuit chips, surface mount components, etc.) may be mounted on a circuit board such as printed circuit board 50. Board components may be interconnected by conductive traces and packaging (e.g., sockets into which integrated circuits are mounted) formed on board 50.

Device 10 may include memory interface circuitry 24 that serves to relay information between memory module 22 and logic circuits 18 that are internal to device 10. Memory interface circuitry 24 may be coupled to memory module 22 through paths 34 (e.g., paths 34-1, 34-2, . . . , 34-N) and 36. During memory read operations, data (DQ) signals and data strobe (DQS) signals may be conveyed from memory module 22 to memory interface circuitry 24 over paths 34. During memory write operations, DQ/DQS may be conveyed from memory interface circuitry 24 to memory module 22 over paths 34.

During read and write operations, control signals such as clock CLK, address ADDR, and command CMD may be conveyed from memory interface circuitry 24 to memory module 22 over path 36. Signal CLK may serve as a system reference clock (e.g., a reference clock to which the DQS signals, ADDR, and CMD should be aligned). Signal CMD may be configured to a first value to initiate a read operation, to a second value to initiate a write operation, to a third value during normal operation, and to other values to initiate any desired operations. Signal ADDR specifies the address (e.g., a selected bank address in a memory device) from which data is read out during read operations and the address to which data is written during write operations.

Memory interface circuitry 24 may serve to perform desired data rate conversions and to generate signals that meet timing requirements specified by the memory protocol currently under use. In some embodiments, memory interface circuitry 24 may include a memory controller that is configured to generate appropriate control signals corresponding to the memory protocol currently under use (e.g., to generate signals for handling memory data management to address desired banks, rows, and columns and to perform memory refresh). The memory controller may also serve to periodically request calibration of memory interface circuitry 24.

In the example of FIG. 2, memory module 22 includes a series of memory devices, at least some of which is sometimes referred to as a memory group. For example, memory module 22 may include first memory group 52-1, second memory group 52-2, . . . , and $N^{th}$ memory group 52-N. Memory module 22 may include at least nine memory groups (as an example). Each of the memory groups may contain hundreds or thousands of memory cells (e.g., dynamic RAM cells). The memory groups may communicate with memory interface circuitry 24 through respective signal paths. For example, first memory group 52-1 may communicate with circuitry 24 by sending data and data strobe signals (DQ/DQS) over path 34-1, second memory group 52-2 may communicate circuitry 24 by sending DQ/DQS over path 34-2, third memory group 52-3 may communicate circuitry 24 by sending DQ/DQS over path 34-3, etc.

In general, memory access operations are not synchronized with system-level control signals CLK/CMD/ADDR. As a result, the DQ signals that are received from the memory groups are not phase aligned with any known clock signal in device 10. It is therefore necessary to provide DQS clock signals with the DQ signals, so that the DQS clocks can be used to establish proper timing relationships when processing the DQ signals. For example, during a read operation, memory interface circuitry 24 uses the DQS clocks in capturing data as it is transmitted over paths 34 from memory 22. In general, the operation of each memory group is somewhat independent, so memory module 22 generates a DQS signal for each of the memory groups.

The DQS signals for the different memory groups are generally not phase aligned with each other (e.g., skew may be present among the DQS signals). For example, although the DQS signal for a first memory group is edge-aligned with the DQ signals in the first memory group, the DQS signal for the first memory group and the seventh memory group (as an example) need not be in phase with each other.

Memory interface circuitry 24 may send control signals to the memory groups via path 36. Memory module 22 in the example of FIG. 2 may be a type of memory module that exhibits inherent non-zero layout skew (e.g., the control signals on path 36 may arrive at each of the memory groups at different times). For example, because of the way path 36 is routed, the control signals on path 36 may arrive first at memory group 52-1 and then arrive at each subsequent memory group after some delay.

During read operations, appropriate control signals may be sent over path 36 to direct the memory groups to output read data. Read data may be generated from the memory groups at different times depending on when control signals CLK/CMD/ADDR arrive at a particular memory group. For example, memory group 52-1 may output read data before subsequent memory group 52-2, memory group 52-2 may output read data before subsequent memory group 52-3, memory group 52-3 may output read data before subsequent memory group 52-4, etc. Memory interface circuitry 24 may therefore receive read data from the different memory groups at staggered times. Memory interface circuitry 24 may include buffer circuitry that can be used to equalize the skew among the different memory groups.

During write operations, care needs to be taken when sending the DQ/DQS signals to the respective memory groups. Device 10 may, for example, operate in a write leveling mode in which the DQ/DQS signals are sent to the respective memory groups at predetermined staggered times. For example, DQ/DQS may be sent over path 34-1 to memory group 52-1 at a first point in time, whereas DQ/DQS may be sent over path 34-2 to subsequent memory group 52-2 at a second point in time that is later than the first point in time (e.g., DQ/DQS for each subsequent memory group may be sent after some adjustable amount of delay). Sending DQ/DQS from memory interface circuitry 24 to the memory groups using this write leveling approach ensures that the DQ/DQS signals and the control signals arrive synchronized (e.g., that the DQ/DQS signals and the CLK signal are phase aligned).

The arrangement of FIG. 2 is merely illustrative and is not intended to limit the scope of the present invention. Integrated circuits other than programmable integrated circuits may include memory interface circuitry 24 that is used to communicate with one or more memory modules 22, each of which can include any suitable number of memory devices.

Figure 3:
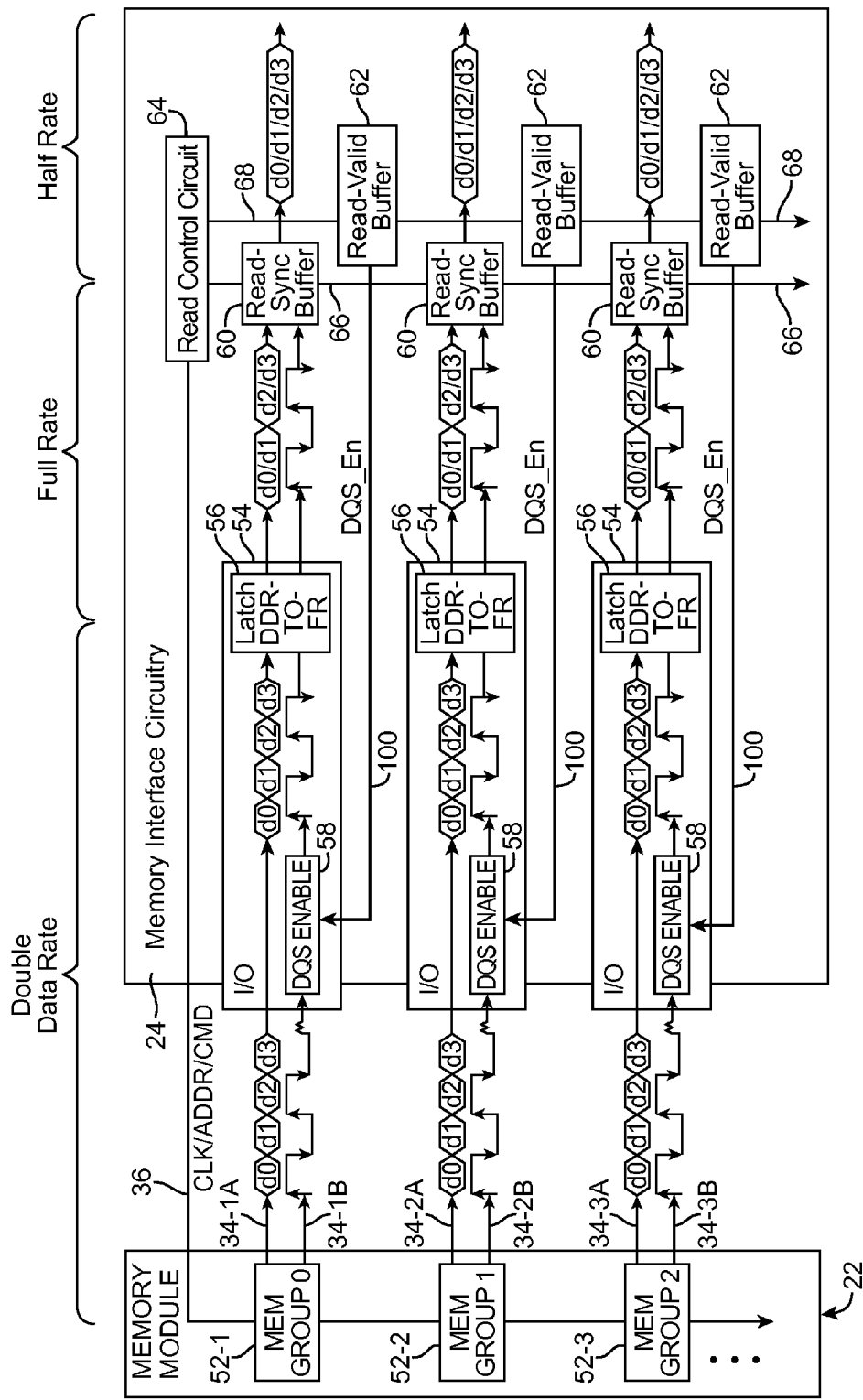
FIG. 3 is a diagram showing an exemplary memory read operation in accordance with an embodiment of the present invention.

FIG. 3 is a diagram showing an illustrative signal flow during read operations. As shown in FIG. 3, the memory groups on memory module 22 may send read signals to corresponding memory interface input-output (I/O) circuits 54 in memory interface circuitry 24. For example, memory group 52-1 may send DQ signals over line 34-1A to a first I/O circuit 54 and may send DQS signals over line 34-1B to the first I/O circuit 54. Similarly, memory group 52-2 may send DQ signals over line 34-2A to a second I/O circuit 54 and may send DQS signals over line 34-2B to the second I/O circuit 54, and so on.

System control signals CLK/ADDR/CMD may be conveyed to the memory groups over path 36. As shown in FIG. 3, memory group 52-1 may output DQ/DQS signals before any other memory group, because group 52-1 receives the system control signals before the other memory group. Similarly, memory group 52-2 may output DQ/DQS signals before all subsequent memory groups (i.e., before memory groups 52-3, 52-4, . . . , 52-N). Memory module 22 may therefore generate read data from the memory groups at different points in time.

Memory interface I/O circuit 54 may include latching circuit 56 and DQS enable circuitry 58. Latching circuit 56 may have a first input that receives DQ signals from an associated memory group and a second input that receives DQS signals from the associated memory group through DQS enable circuitry 58. Circuitry 58 may serve to align the DQS signals to the DQ signals and may also serve to gate the DQS signals so that any glitches present before or after the DQS burst are eliminated. In some embodiments, circuitry 58 configured to align the DQS signals to the DQ signals may shift the DQS signals with respect to the DQ signals and may therefore sometimes be referred to as DQS shift and enable circuitry.

DQS enable circuitry 58 may receive a DQS_En signal from an associated read-valid buffer 62 (sometimes referred to as a first-in-first-out circuit) via path 100. Buffer 62 may be coupled to a control circuit such as read control circuit 64. Read control circuit 64 may be used to generate system control signals CLK/ADDR/CMD over path 36 and may also be used to provide an enable signal having a pulse width that is approximately equal to the desired DQS burst length. The enable signal may be provided to each read-valid buffer 62 over path 68. Buffer 62 may delay the enable signal by some adjustable amount to generate a corresponding DQS_En signal.

Latching circuit 56 may serve to latch the DQ signals (received at its first input) at the rising and falling edges of the DQS signals (received at its second input). Latching circuit 56 of this type may therefore sometimes be referred to as a double-edge-triggered data capture circuit. The DQ signals received by latching circuit 56 toggle at both rising and falling edges of DQS. Data transfer of this type may sometimes be referred to as double data rate (DDR) transmission.

Latching circuit 56 may have first and second outputs. DQ signals transmitting at full data rate (FR) may be provided at the first output of latching circuit 56. DQS signals provided at the second output of latching circuit 56 may be a substantially unaltered version of the DQS signals received at the second input of latching circuit 56. The DQ signals generated at the first output of latching circuit 56 may be a two-bit parallel output signal toggling at the rising edges of DQS (as an example). Latching circuit 56 that is used to capture and output data in this arrangement may sometimes be referred to as a DDR-to-FR capture circuit.

Memory interface I/O circuit 54 may be coupled to an associated read-synchronization buffer 60. In particular, read-sync buffer 60 may have a first input coupled to the first output of latching circuit 56 and a second input coupled to the second output of latching circuit 56. Buffer 60 may, for example, have an output on which a four-bit parallel output signal toggling at every other rising edge of DQS received at its second input is provided (e.g., buffer 60 may output data at half data rate (HR)). The output of buffer 60 fed to corresponding logic circuits 18 on device 10. Buffer 60 that is used to delay and output data in this way may sometimes be referred to as a FR-to-HR buffer circuit.

Buffer 60 may be coupled to read control circuit 64. Read control circuit 64 may be used to synchronize buffers 60 so that read data is output simultaneously in parallel (e.g., by sending control signals to read-sync buffers 60 over line 66). Read control circuit 64 may include a read latency counter that takes into account a maximum round trip delay. The maximum round trip delay may be equal to the amount of time elapsed since the launch of a read command (on path 36) to the time DQ signals arrive at buffer 60 associated with last memory group 52-N (i.e., the memory group that is last to receive the read command). Data is read out from buffers 60 in parallel when the counter exceeds a predetermined threshold. The predetermined threshold may be at least equal to or greater than the maximum round trip delay. Delaying the read-sync buffers in this way ensures that the data from the memory groups has successfully been stored at the read-sync buffers prior to readout.

As shown in FIG. 3, DQS enable circuitry 58 may have a first input that receives a DQS signal from memory module 22, a second input that receives signal DQS_En from associated read-valid buffer 62, and an output on which a clean and/or shifted DQS signal is provided. In general, the DQS signal that is being conveyed from memory module 22 to the first input of DQS enable circuitry 58 can exhibit unwanted glitches. Circuitry 58 may be used to filter out these spurious signals. Signal DQS_En that is generated by read control circuit 64 may have a pulse width that is equal to the period of time during which valid DQ signals are being transmitted. This need not be the case if DQS enable circuitry 58 includes self-timed circuitry for monitoring the duration that a data strobe gating signal should be asserted following assertion of DQS_En. When signal the data strobe gating signal is asserted, the received DQS signal will be passed to the output of circuitry 58. When the data strobe gating signal is deasserted, the received DQS signal will not be passed through to the output of circuitry 58 (e.g., the output of circuitry 58 may be actively driven low), thereby preventing invalid data from being inadvertently latched by circuit 56.

Memory interface circuitry 24 may be calibrated prior to normal operation so that a rising edge of signal DQS_En is detected by DQS enable circuitry 58 during a predetermined window of time immediately prior the arrival of valid read DQ signals (e.g., during a read pre-amble time period). As memory operating speeds increase, the predetermined window of time within which signal DQS_En should be detected by DQS enable circuitry 58 decreases. Furthermore, in the presence of random variations such as jitter and voltage/temperature variations, it becomes increasingly difficult for the first valid rising edge of DQS_En to be positioned within the predetermined window. It may therefore be desirable to provide DQS enable circuitry 58 exhibiting less stringent timing requirements.

Figure 4:
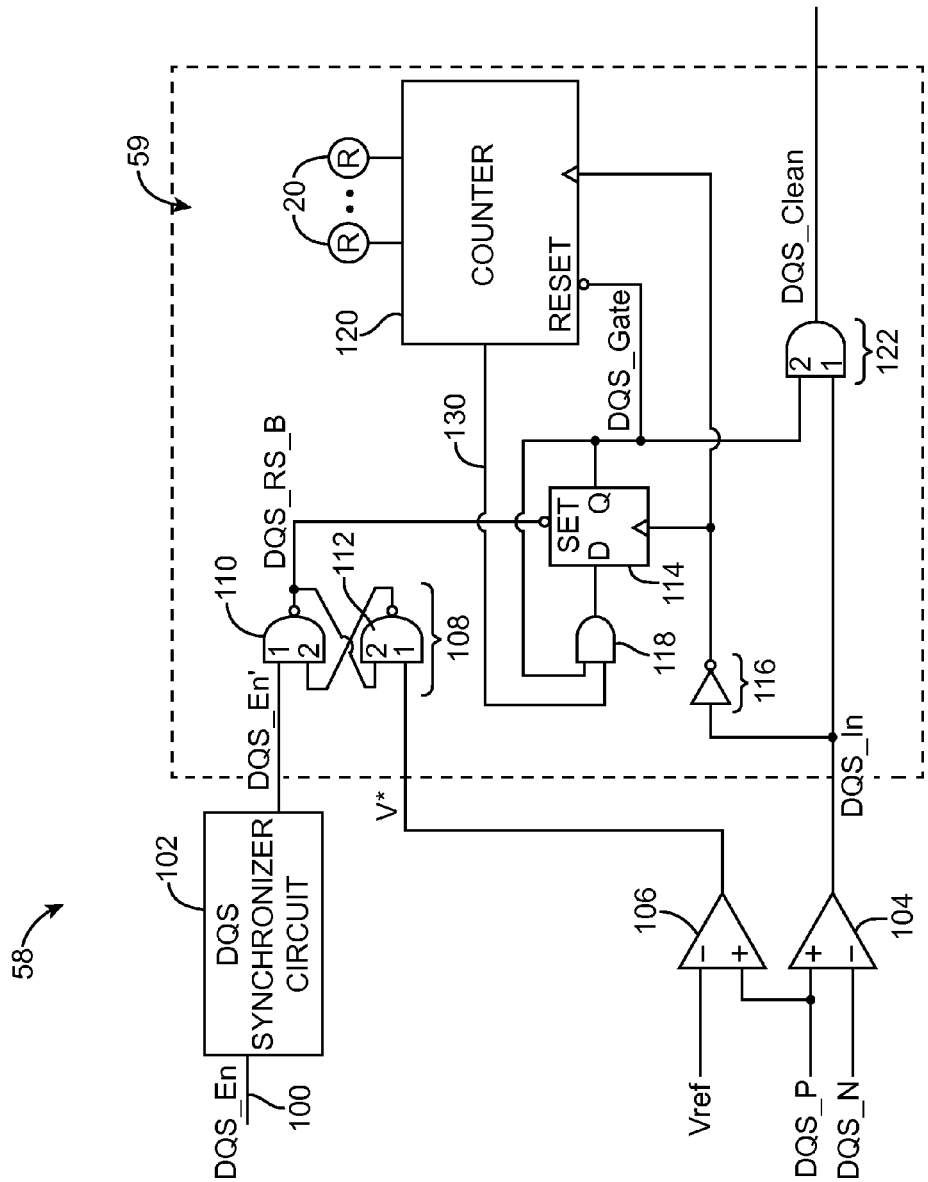
FIG. 4 is a circuit diagram of illustrative data strobe enable circuitry in accordance with an embodiment of the present invention.

FIG. 4 shows a circuit diagram of DQS enable circuitry 58 with improved timing margins. As shown in FIG. 4, circuitry 58 may include a DQS synchronizer circuit 102, an input buffer 104, a reference buffer 106, a latching circuit 108, a flip-flop 114, a counter 120, and a gating circuit 122. The DQS signals provided from memory module 22 to memory interface circuitry 24 may be transmitted as differential signals (as an example). Circuitry 58 may therefore receive a differential DQS signal that includes a positive signal portion DQS_P and a negative signal portion DQS_N.

Buffer 104 may have a first (positive) input that receives signal DQS_P, a second (negative) input that receives signal DQS_N, and an output on which a corresponding single-ended data strobe signal DQS_In is generated. When DQS_P is greater than DQS_N, buffer 104 may drive DQS_In high (e.g., to a logic "1"). When DQS_P is less than DQS_N, buffer 104 may drive DQS_In low (e.g., to a logic "0"). If DQS_P and DQS_N are approximately equal, then signal DQS_In at the output of buffer 104 may be an indeterminate value. Signal DQS_In can therefore be considered as a single-ended version of the differential DQS signal that includes DQS_P and DQS_N. Buffer 104 operated in this way may sometimes be referred to as a differential-to-single-ended buffer circuit.

Buffer 106 may have a first (positive) input that receives signal DQS_P, a second (negative) input that receives a reference signal Vref, and an output on which comparator output signal V* is provided. Reference signal Vref may have a fixed intermediate voltage level that is halfway between a logic "0" and a logic "1" (as an example). Consider, for example, a scenario in which DQS_P and DQS_N toggles between 1.2 V and zero volts. In this example, voltage Vref may be equal to 0.6 V or other suitable fraction of 1.2 V. When DQS_P is driven high (i.e., when DQS_P is greater than Vref), buffer 106 may drive signal V* high. When DQS_P is driven low (i.e., when DQS_P is less than Vref), buffer 106 may drive signal V* low. Buffer 106 operated in this way may sometimes be referred to as a comparator circuit.

DQS synchronizer circuit 102 may have an input that receives signal DQS_En via path 100 and an output on which a delayed version of DQS_EN is provided (e.g., an output on which DQS_En' is generated). Synchronizer circuit 102 may be configured to delay DQS_En by a calibrated amount of delay such that DQS_En' rises high during a predetermined time period before the first valid DQ signal arrives at read latch circuit 56. Synchronizer 102 may also be configured to stretch the pulse width of signal DQS_En by half a clock cycle (e.g., so that DQS_En' is asserted half a clock cycle longer than DQS_En) and to synchronize DQS_En' to an internal system clock in device 10. Synchronizer 102 operated in this way may sometimes be referred to as a retiming circuit.

Latching circuit 108 may be implemented using two cross-coupled logic gates such as logic NAND gates 110 and 112. In particular, logic NAND gate 110 may have a first input that receives signal DQS_En' from synchronizer 102, a second input, and an output. Logic NAND gate 112 may have a first input that receives signal V* from comparator 106, a second input that is coupled to the output of gate 110, and an output that is coupled to the second input of gate 110. The output of logic NAND gate 110 may serve as an output for latching circuit 108 on which an active low reset signal DQS_RS_B is provided.

When signal DQS_EN' is low (regardless of the signal level of V*), latch 108 may drive DQS_RS_B high (e.g., signal DQS_RS_B may be deasserted). When signal DQS_EN' is high and when signal V* is low, latch 108 may drive DQS_RS_B low (e.g., signal DQS_RS_B may be asserted). When signals DQS_EN' and V* are both high, latch 108 may hold its previously stored value (e.g., signal DQS_RS_B may remain unchanged). Latch 108 configured using this arrangement may be referred to as a set-reset (SR) NAND latch, where signal DQS_En' serves as the active low "set" input signal and where comparator output signal V* serves as the active low "reset" input signal. The implementation of latch 108 as shown in FIG. 4 is merely illustrative. If desired, latch 108 may be implemented using other types of logic gates such as logic OR gates, NOR gates, AND gates, inverters, and combinations of these gates.

Flip-flop 114 may have a data input terminal D that is coupled to an output of logic AND gate 118, a data output terminal Q on which DQS gating signal DQS_Gate is provided, an active low "set" input that receives signal DQS_RS_B from latch 108, and a clock input that receives an inverted version of DQS_In via inverter 116. Logic AND gate 118 may have a first input that is coupled to flip-flop output terminal Q and a second input that receives a control signal from counter 120 via path 130. Connected in this way, flip-flop 114 may latch new data in response to falling clock edges of DQS_In.

When DQS_RS_B is high, flip-flop 114 may operate normally (e.g., flip-flop 114 may latch new data at each falling edge of DQS_In when DQS_RS_B is deasserted). When DQS_RS_B is driven low, flip-flop 114 may drive its output high (e.g., DQS_Gate may be driven high whenever reset signal DQS_RS_B is asserted). Logic AND gate 118 may provide a logic "1" to input terminal D of flip-flop 114 only when signal DQS_Gate and the counter control signal on path 130 are both high. Signal DQS_Gate should be asserted within a clock cycle prior to the arrival of valid DQ signals. The control signal from counter 130 is nominally asserted and may be temporarily deasserted a predetermined number of clock cycles after assertion of DQS_Gate, as monitored using counter 120.

Counter 120 may have a clock input that receives the inverted version of DQS_In, an active low "reset" input that receives signal DQS_Gate from flip-flop 114, an output that supplies the control signal to logic AND gate 118 via path 130, and control inputs operable to receive static control bits from memory elements 20. When DQS_Gate is low, counter 120 may be placed in an idle reset mode in which its count value remains at zero. When DQS_Gate is high, counter 120 is released from the idle reset mode and is allowed to increment its count value at falling clock edges of DQS_In.

As described above, the control signal on output path 130 is generally asserted and may be temporarily deasserted when the count value reaches a given threshold value. The given threshold value may be controlled by the bits stored in memory elements 20. Storage element 20 may be a volatile memory element (e.g., a CRAM cell loaded with configuration data, etc.) or a nonvolatile memory element (e.g., fuses, antifuses, electrically-programmable read-only memory elements, etc.). In general, the count should be based on the length of each valid DQ stream. For example, if an incoming data stream includes eight data bits, counter 120 may be configured to count up to three before asserting the control signal on output 130 (e.g., counter 120 may receive a first set of control data bits from storage elements 20 so that counter 120 will assert the counter control signal on path 130 when its count value is equal to a given threshold count of three). As another example, if an incoming data stream includes 10 data bits, counter 120 may be configured to count up to four before asserting the control signal on output 130 (e.g., counter 120 may receive a second set of control data bits from storage elements 20 so that counter 120 will assert the control signal when its count value is equal to a new threshold count of four). Asserting the control signal on output path 130 effectively serves to drive DQS_Gate high on the next falling edge of DQS_In, which in turn resets counter 120.

Figure 5:
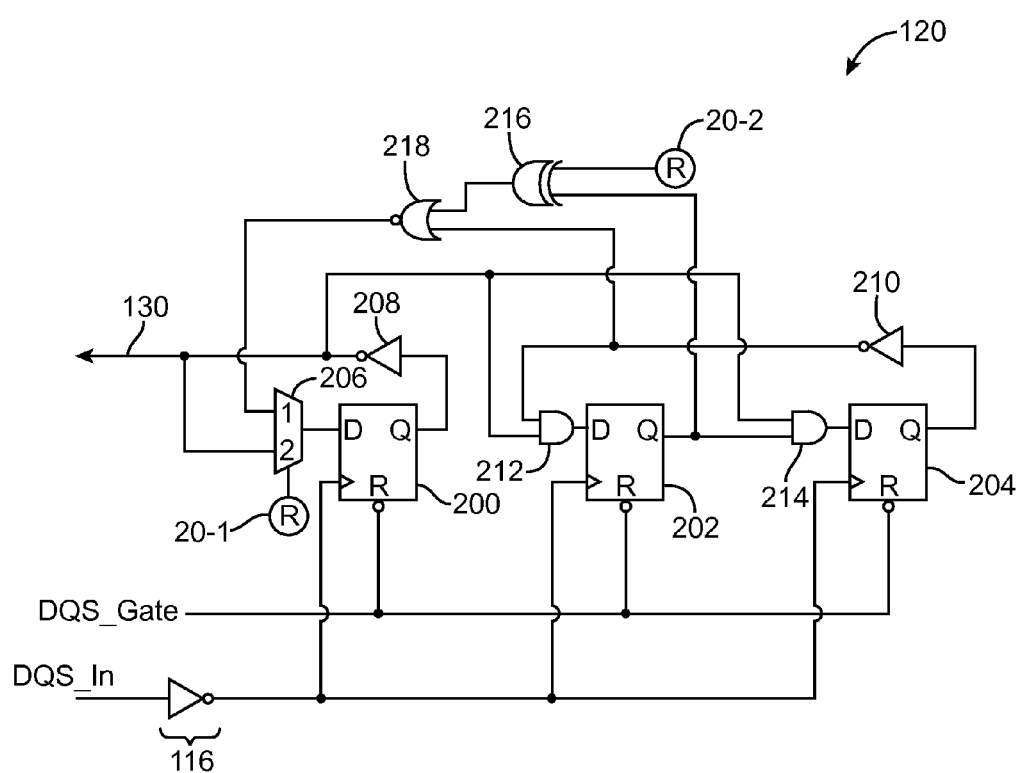
FIG. 5 is a circuit diagram of an illustrative programmable counter in accordance with an embodiment of the present invention.

FIG. 5 shows one suitable implementation of counter 120. As shown in FIG. 5, counter 120 may include a first flip-flop 200, a second flip-flop 202, a third flip-flop 204, a multiplexing circuit 206, inverters 208 and 210, logic AND gates 212 and 214, a logic XOR gate 216, and a logic NOR gate 218. Flip-flops 200, 202, and 204 may each have a clock input that receives an inverted version of signal DQS_In via inverter 116 of FIG. 4, an active low reset input that receives signal DQS_Gate from flip-flop 114, a data input terminal D, and a data output terminal Q.

Output terminal Q of flip-flop 200 may be coupled to output path 130 via inverter 208 (e.g., inverter 208 may have an input that is coupled to terminal Q of the first flip-flop and an output that is coupled to path 130). Inverter 208 may therefore serve to drive the control signal on output path high whenever the first flip-flop latches a logic "0" at its input D or to drive the control signal on output path low whenever the first flip-flop latches a logic "1" at its input D. Output terminal Q of flip-flop 204 may be coupled to inverter 210 (e.g., inverter 210 may have an input that is coupled to terminal Q of the third flip-flop and an output). Logic AND gate 212 may have a first input that is coupled to the output of inverter 208, a second input that is coupled to the output of inverter 210, and an output that is coupled to input terminal D of flip-flop 202. Logic AND gate 214 may have a first input that is coupled to output terminal Q of flip-flop 202, a second input that is coupled to the output of inverter 208, and an output that is coupled to input terminal D of flip-flop 204.

Logic XOR gate 216 may have a first input that receives a static control bit from storage element 20-2, a second input that is coupled to output terminal Q of flip-flop 202, and an output. Logic NOR gate 218 may have a first input that is coupled to the output of gate 216, a second input that is coupled to the output of inverter 210, and an output. Multiplexer 206 may have a first input that is coupled to the output of gate 218, second input that is coupled to the output of inverter 208, an output that is coupled to input terminal D of flip-flop 200, and a control input that receives a static control bit from storage element 20-1. Multiplexer 206 may be configured to route signals from its first input to its output when the static control bit provided from element 20-2 is low and may be configured to route signals from its second input to its output when the static control bit provided from element 20-2 is high.

Consider, for example, a scenario in which counter 120 of FIG. 5 receives a first control bit from storage element 20-1 and a second control bit from storage element 20-2. If the first control bit is low, counter 120 may be programmed to handle an incoming data stream with a bit length of four. If the first control bit is high, counter 120 may be programmed to handle an incoming data stream with a bit length of eight (if the second control bit is high) or a bit length of ten (if the second control bit is low). Counter 120 of FIG. 5 may therefore be adjusted to handle bit streams with a bit length of four, eight, or ten. Counter 120 of this type may sometimes be referred to as a Johnson counter. This is merely illustrative. If desired, DQS enable circuitry 58 may include a counter 120 that is implemented using other counter architectures, that includes more than three flip-flops and other types of logic gates and switching circuitry, and that can be programmed to handle data streams with any suitable bit length (e.g., to handle data streams with a bit length of two, six, 12, 16, 20, 32, etc.).

Logic AND gate 122 may have a first input that receives signal single-ended data strobe signal DQS_In from buffer 104, a second input that receives data strobe gating signal DQS_Gate from flip-flop 114, and an output on which signal DQS_Clean is provided. Signal DQS_Clean generated in this way represents a selective portion of signal DQS_In (e.g., DQS_Clean represents a "filtered" version of signal DQS_In, where DQS_Clean is sampled from DQS_In during time periods in which gating signal DQS_Gate is asserted). The position of DQS_Gate relative to DQS signals needs to be fairly accurate to ensure that valid DQS signals are being passed through as DQS_Clean while preventing invalid DQS signals (i.e., undesired glitches during idle times) from corrupting DQS_Clean.

Latch 108, flip-flop 114, counter 120, gate 122, gate 118, and inverter 116 may sometimes be referred to collectively as a latching and gating circuit 59 (see, e.g., FIG. 4). Latching and gating circuit 59 may have a first input that receives single-ended data strobe signal DQS_In, a second input that receives comparator output signal V*, a third input that receives data strobe enable signal DQS_En', and an output at which signal DQS_Clean (e.g., a gated version of single-ended data strobe signal DQS_In) is provided.

Figure 6:
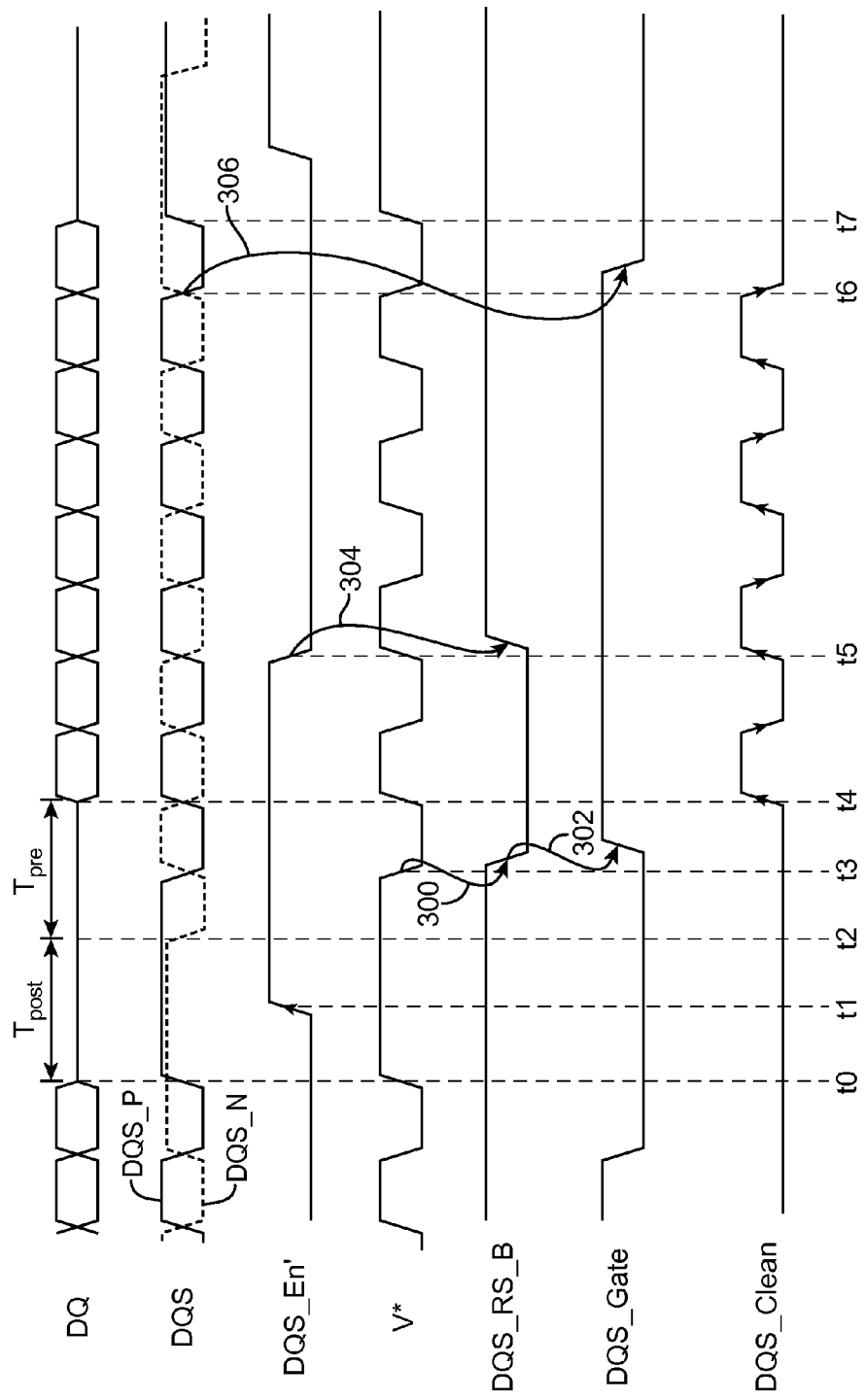
FIGS. 6 and 7 are timing diagrams illustrating the operation of the data strobe enable circuitry of the type shown in FIG. 4 in accordance with an embodiment of the present invention.

FIG. 6 is a timing diagram that illustrates the operation of DQS enable circuitry 58. FIG. 6 shows the behavior of relevant waveforms during two successive read operations. Time t0 marks the end of a first read data stream, whereas time t4 marks the start of a second successive read data stream. The time period immediately following time t0 may be referred to as a read post-amble window Tpost (e.g., window Tpost may extend from time t0 to t2), whereas the time period immediately preceding time t4 may be referred to as a read pre-amble window Tpre (e.g., window Tpre may extend from time t2 to t4). The time period between two successive read data streams may be referred to as an idle time period with a duration that is equal to the sum of Tpost and Tpre. Memory interface circuitry 24 may receive invalid data from memory 22 during idle time periods. In the example of FIG. 6, windows Tpost and Tpre are each one cycle in duration. If other suitable arrangements, Tpost and Tpre may have different durations and may last more than one clock cycle.

As shown in FIG. 6, the DQS signal may be pulled high during window Tpost (e.g., signal DQS_P and DQS_N are both driven high during Tpost), which is consistent with double data rate type four (DDR4) input-output standards (as an example). When signal DQS_P is pulled high at the beginning of window Tpost (at time t0), comparator 106 may drive signal V* high since comparator 106 drives signal V* high whenever DQS_P exceeds intermediate reference voltage Vref (see, FIG. 4). At this time, signal DQS_RS_B may be high and signals DQS_Gate and DQS_Clean may both be deasserted.

In the example of FIG. 6, signal DQS_En' may arrive during read post-amble window Tpost (e.g., signal DQS_En' may rise high at time t1). Since signal V* is already high, latch 108 will hold its current value (e.g., signal DQS_RS_B will remain unaltered).

During the read pre-amble window, the DQS signal may begin clocking (see, signals DQS_P and DQS_N toggling during window Tpre). In this example, the DQS signal may begin toggling one cycle prior to the arrival of valid DQ signals. At time t3, the falling edge of DQS_P may cause comparator 106 to drive signal V* low. This falling edge in signal V* while DQS_En' is high may cause latch 108 to drive signal DQS_RS_B low (as indicated by arrow 300). A falling edge in signal DQS_RS_B may then prompt flip-flop 114 to drive signal DQS_Gate high, as indicated by arrow 302 (e.g., assertion of signal DQS_RS_B may cause flip-flop 114 to "set" its output to a logic "1"). When DQS_Gate is high, counter 120 may begin incrementing its count at the falling clock edges of DQS_P (e.g., or at the rising clock edges of DQS_N). Signal DQS_Gate has therefore been successfully driven high prior to the first rising DQS clock edge corresponding to the arrival of the valid read data stream. At time t4, the DQS signal may be passed through to the output of circuitry 58 as signal DQS_Clean as long as signal DQS_Gate is asserted.

At time t5, signal DQS_En' may be deasserted. The pulse width of DQS_En' is generally less than the duration of each read data stream and may be greater than the sum of Tpost and Tpre (as an example). The falling edge of signal DQS_En' may force latch 108 to drive signal DQS_RS_B high regardless of the magnitude of signal V* (as indicated by arrow 304), thereby allowing flip-flop 114 to latch new data at its output. Flip-flop 114 will continue holding a logic "1" at its output until the control signal on path 130 is deasserted (e.g., signal DQS_Gate will remain high until the counter reaches a predetermined count threshold).

One clock cycle before the last valid falling clock edge of the DQS signal, counter 120 may deassert the control signal on path 130, which presents a logic "0" at input terminal D of flip-flop 114. The last valid falling clock edge of the DQS signal (at time t6) may result in flip-flop 114 latching a logic "0" at its output terminal Q (e.g., signal DQS_Gate may be deasserted in response to the last valid falling DQS clock edge, as indicated by arrow 306). Since DQS_Gate is deasserted in response to detection of the last valid falling DQS clock edge, the last valid falling DQS clock edge will still be present in signal DQS_Clean. Time t7 signifies the end of the second read data stream and the start of the next read post-amble window. Signal DQS_Clean may continue to be generated in this way (e.g., using circuitry 58 of the type described in connection with FIG. 4) during successive memory read operations.

Figure 7:
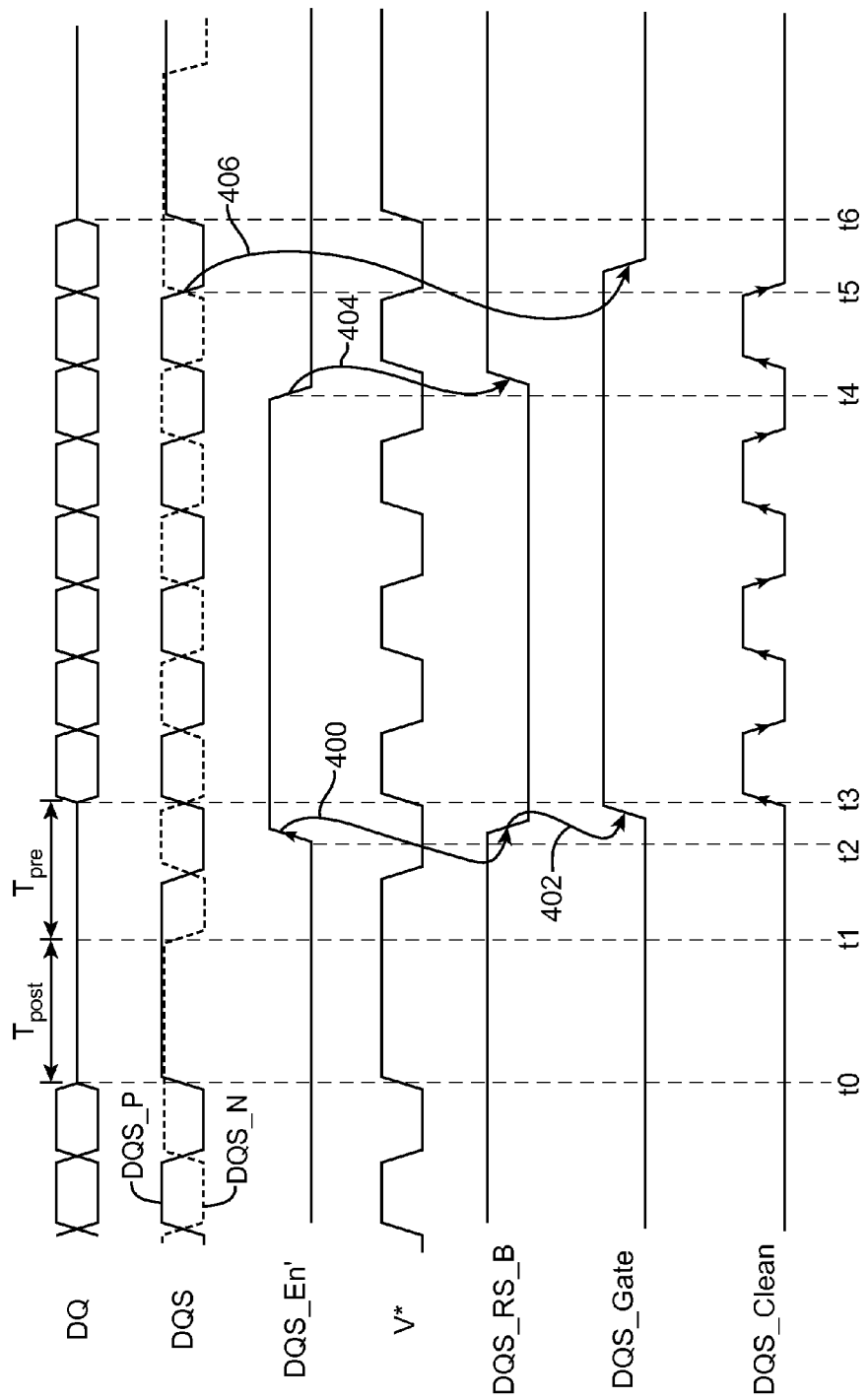

In another suitable embodiment, signal DQS_En' may arrive during read pre-amble window Tpre (see, e.g., FIG. 7, signal DQS_En' may rise high at time t2). As shown in FIG. 7, time t0 marks the left edge of window Tpost, whereas time t1 marks the right edge of window Tpost and the beginning of window Tpre. The rising edge of signal DQS_En' at time t2 while V* is low may cause latch 108 to drive signal DQS_RS_B low (as indicated by arrow 400). Even if signal DQS_En' rises high while V* is high, signal DQS_RS_B will still be driven low when signal V* falls to a logic "0" before the end of Tpre (e.g., signal DQS_RS_B will be driven low as along as DQS_En' arrives during window Tpre). A falling edge in signal DQS_RS_B may then prompt flip-flop 114 to drive signal DQS_Gate high, as indicated by arrow 402. When DQS_Gate is high, counter 120 may begin incrementing its count at the falling clock edges of DQS_P. Signal DQS_Gate has therefore been successfully driven high prior to the first rising DQS clock edge corresponding to the arrival of the valid read data stream. At time t3, the DQS signal may be passed through to the output of circuitry 58 as signal DQS_Clean for as long as signal DQS_Gate is asserted.

At time t4, signal DQS_En' may be deasserted. The falling edge of signal DQS_En' may force latch 108 to drive signal DQS_RS_B high regardless of the magnitude of signal V* (as indicated by arrow 404), thereby allowing flip-flop 114 to latch new data at its output. Flip-flop 114 will continue holding a logic "1" at its output until the control signal on path 130 is deasserted.

Counter 120 may deassert the control signal on path 130 one clock cycle before the last valid falling clock edge of the DQS signal, which presents a logic "0" at input terminal D of flip-flop 114. The last valid falling clock edge of the DQS signal (at time t5) may result in flip-flop 114 latching a logic "0" at its output terminal Q (e.g., signal DQS_Gate may be deasserted in response to the last valid falling DQS clock edge, as indicated by arrow 406). Since DQS_Gate is deasserted in response to detection of the last valid falling DQS clock edge, the last valid falling DQS clock edge will still be present in signal DQS_Clean. Time t6 signifies the end of the second read data stream and the start of the next read post-amble window. Signal DQS_Clean may continue to be generated in this way (e.g., using circuitry 58 of the type described in connection with FIG. 4) during successive memory read operations.

The timing diagram of FIGS. 6 and 7 in which the rising/falling clock edges of DQS_are aligned with the edges of the DQ stream is merely illustrative. If desired, DQS_Clean be shifted 90° in phase with respect to the DQ stream so that the rising/falling edges are positioned at the center of each DQ bit. As illustrated in FIGS. 6 and 7, DQS enable circuitry 58 of the type described in connection with FIG. 4 can be used to properly generate signal DQS_Clean as long signal DQS_En' arrives at latch 108 during either the read post-amble window Tpost or the read pre-amble window Tpre. The total window of time in which signal DQS_En' should be positioned is therefore equal to the sum of Tpost and Tpre (sometimes referred to collectively as an idle time window). Ideally, memory interface circuitry 24 should be calibrated such that DQS_En' rises high at the center of the idle time window. Consider the example of FIG. 7 where DQS_En' is positioned at time t1. In this scenario, signal DQS_En' would have an improved error margin of +/− one cycle to shift in either direction while still exhibiting proper functionality.

Figure 8:
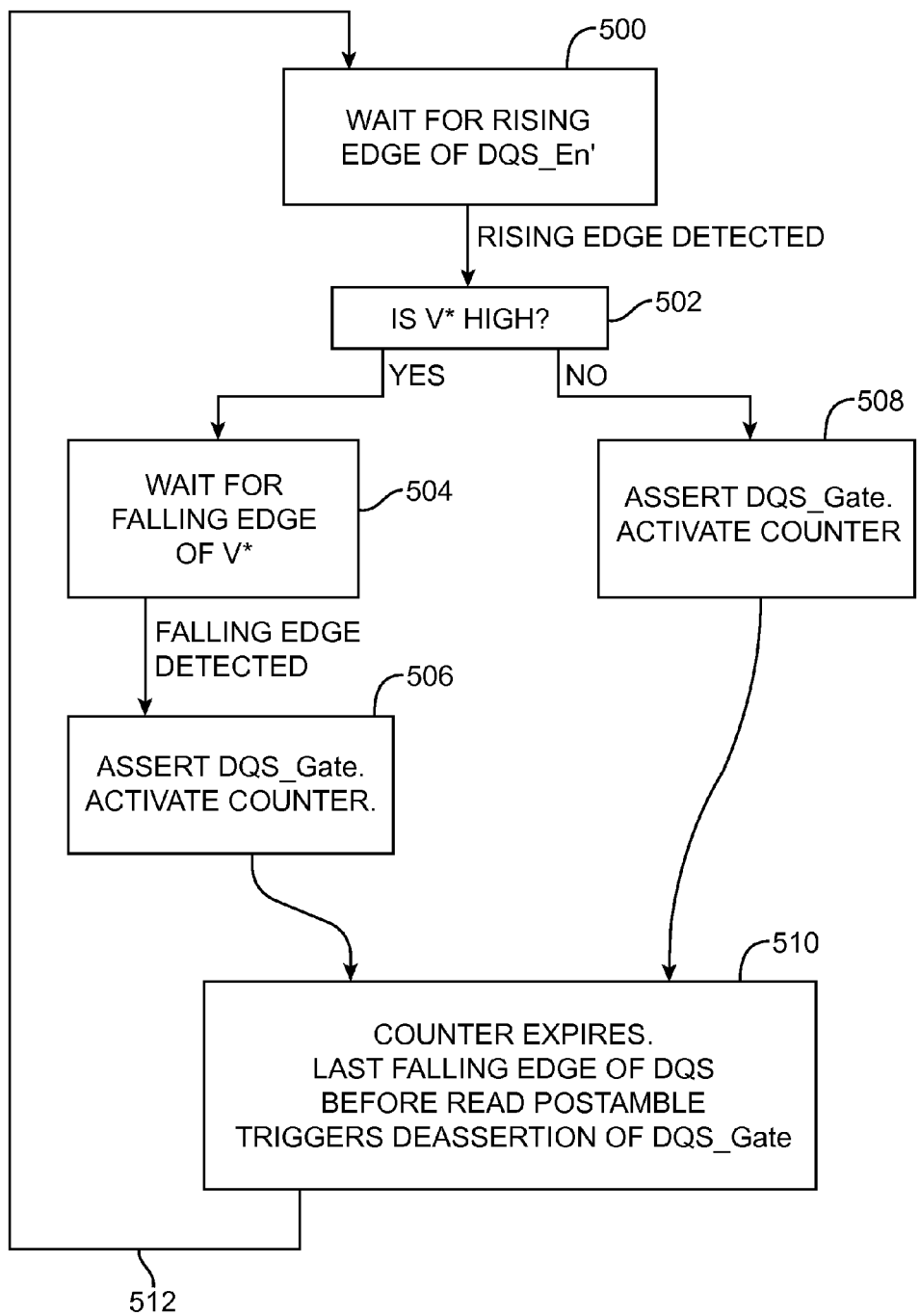
FIG. 8 is a flow chart of illustrative steps for generating a data strobe gating signal in accordance with an embodiment of the present invention.

FIG. 8 is a flow chart of illustrative steps that summarizes the operation of DQS enable circuitry 58. At step 500, latch 108 may wait for a rising edge in signal DQS_En'. In response to detecting a rising edge in DQS_En' and if signal V* is low (e.g., if DQS_En' arrives a half clock cycle before the end of Tpre), latch 108 may immediately drive DQS_RS_B low, which in turn forces flip-flop 114 to output a high DQS_Gate (step 508). When DQS_Gate is high, counter 120 exits reset mode and may begin incrementing its count value.

In response to detecting a rising edge in DQS_En' and if signal V* is high (e.g., if DQS_En' arrives during Tpost or during a first half clock cycle at the beginning of Tpre), latch 108 may wait for signal V* to fall low (step 504). In response to detecting a falling edge in signal V*, latch 108 may drive DQS_RS_B low, which in turn forces flip-flop to drive DQS_Gate high (step 506). When DQS_Gate is high, counter 120 is released from reset mode and may begin incrementing its count value.

When counter 120 expires (e.g., when the count value of counter 120 reaches a predetermined threshold value), a logic "0" will be presented to input terminal D of flip-flop 114. The next falling DQS clock edge (i.e., the next falling edge of DQS_In) will then result in flip-flop latching a low DQS_Gate, thereby preventing DQS_In from being passed through to the output of circuitry 58. Processing may loop back to step 500 to execute additional read request, as indicated by path 512.

The foregoing is merely illustrative of the principles of this invention and various modifications can be made by those skilled in the art without departing from the scope and spirit of the invention. The foregoing embodiments may be implemented individually or in any combination.

What is claimed is:

1. Circuitry, comprising:
    a differential-to-single-ended buffer that receives a differential data strobe signal that includes first and second signals and that outputs a corresponding single-ended data strobe signal;
    a comparator that receives the first signal and a reference signal and that outputs a corresponding comparator output signal; and
    a latching and gating circuit having a first input that receives the single-ended data strobe signal, a second input that receives the comparator output signal, and an output at which the latching and gating circuit outputs a corresponding gated version of the single-ended data strobe signal.

2. The circuitry defined in claim 1, wherein the latching and gating circuit includes a latch having a first input that receives the comparator output signal and a second input that receives a data strobe enable signal.

3. The circuitry defined in claim 2, wherein the latch comprises a plurality of cross-coupled logic gates.

4. The circuitry defined in claim 1, wherein the latching and gating circuit includes a flip-flop having a control input that receives the single-ended data strobe signal and an output on which a data strobe gating signal is provided.

5. The circuitry defined in claim 4, wherein the latching and gating circuit further includes a gate having a first input that receives the single-ended data strobe signal, a second input that receives the data strobe gating signal from the flip-flop, and an output on which the gated version of the single-ended data strobe signal is provided.

6. The circuitry defined in claim 5, wherein the gate comprises a logic AND gate.

7. The circuitry defined in claim 1, wherein the latching and gating circuit includes a counter having a control input that receives the single-ended data strobe signal.

8. The circuitry defined in claim 1, wherein the latching and gating circuit comprises:
    a latch that receives the comparator output signal and a data strobe enable signal and that outputs a reset signal;
    a flip-flop having a clock input that receives an inverted version of the single-ended data strobe signal, a control input that receives the reset signal, an input, and an output on which a data strobe gating signal is provided;
    a counter that receives the inverted version of the single-ended data strobe signal and the data strobe gating signal and that outputs a counter output signal, wherein the input of the flip-flop receives an input signal generated based on combination of the data strobe gating signal and the counter output signal; and
    a gate that that receives the single-ended data strobe signal and the data strobe gating signal and that outputs the gated version of the single-ended data strobe signal.

9. A method of operating memory interface circuitry on an integrated circuit, comprising:
    with the memory interface circuitry, receiving a data strobe signal from memory that is external to the integrated circuit;
    detecting assertion of a data strobe enable signal while the memory interface circuitry is receiving invalid data and while the data strobe signal is asserted; and
    in response to detecting the assertion of the date strobe enable signal, asserting a data strobe gating signal before valid data arrives at the memory interface circuitry from the memory.

10. The method defined in claim 9, further comprising:

using the data strobe gating signal to determine whether the data strobe signal is used by the memory interface circuitry for receiving the valid data.

11. The method defined in claim 9, wherein receiving the data strobe signal comprises receiving a differential data strobe signal that includes first and second signals from the memory.

12. The method defined in claim 11, wherein detecting the assertion of the data strobe enable signal comprises detecting the assertion of the data strobe enable signal while the memory interface circuitry is receiving invalid data and while the first and second signals are asserted.

13. The method defined in claim 11, further comprising:

detecting assertion of the data strobe enable signal while the memory interface circuitry is receiving invalid data, while the first signal is asserted, and while the second signal is deasserted.

14. The method defined in claim 13, further comprising:

in response to detecting the assertion of the data strobe enable signal while the second signal is deasserted, asserting the data strobe gating signal before valid data arrives at the memory interface circuitry from the memory.

15. The method defined in claim 9, further comprising:

with a gating circuit, receiving the data strobe signal and the data strobe gating signal and outputting a corresponding gated version of the data strobe signal.

16. A method for operating memory interface circuitry on an integrated circuit, comprising:

with a comparator, receiving a data strobe signal from memory that is external to the integrated circuit, receiving a reference signal, and outputting a comparator output signal;

detecting assertion of a data strobe enable signal; and in response to detecting the assertion of the data strobe enable signal while the comparator output signal is high, waiting for the comparator output signal to be driven low before asserting a data strobe gating signal.

17. The method defined in claim 16, wherein asserting the data strobe gating signal comprises asserting the data strobe gating signal before valid data arrives at the memory interface circuitry from the memory.

18. The method defined in claim 16, further comprising:

in response to detecting the assertion of the data strobe enable signal while the comparator output signal is low, immediately asserting the data strobe gating signal.

19. The method defined in claim 16, wherein the data strobe signal comprises a differential data strobe signal that includes first and second signals, wherein receiving the data strobe signal comprises receiving the first signal with the comparator, the method further comprising:

with a buffer, receiving the first and second signals and outputting a single-ended data strobe signal.

20. The method defined in claim 19, further comprising:

with a gating circuit, receiving the data strobe gating signal and the single-ended data strobe signal and outputting a corresponding gated version of the single-ended data strobe signal.

* * * * *